(12) United States Patent
Chae (10) Patent No.: US 10,371,738 B2
(45) Date of Patent: Aug. 6, 2019

(54) APPARATUS FOR DETERMINING ABNORMAL STATUS OF WIRELESS POWER TRANSMISSION COIL

(71) Applicant: LG INNOTEK CO., LTD., Seoul (KR)

(72) Inventor: Yong Suk Chae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 41 days.

(21) Appl. No.: 15/543,720

(22) PCT Filed: Jan. 5, 2016

(86) PCT No.: PCT/KR2016/000045
§ 371 (c)(1),
(2) Date: Jul. 14, 2017

(87) PCT Pub. No.: WO2016/114520
PCT Pub. Date: Jul. 21, 2016

(65) Prior Publication Data
US 2017/0356950 A1    Dec. 14, 2017

(30) Foreign Application Priority Data

Jan. 15, 2015 (KR) .......................... 10-2015-0007333

(51) Int. Cl.
*G01R 31/02* (2006.01)
*G01R 31/06* (2006.01)
(Continued)

(52) U.S. Cl.
CPC ............ *G01R 31/027* (2013.01); *B60L 53/12* (2019.02); *G01R 31/024* (2013.01); *H02J 5/005* (2013.01);
(Continued)

(58) Field of Classification Search
CPC ........ G01R 31/02; G01R 31/06; G01R 21/00; H02J 5/00; H02J 17/00; H01F 38/14
See application file for complete search history.

(56) References Cited

U.S. PATENT DOCUMENTS

2001/0035688 A1    11/2001    Sawada et al.
2013/0009650 A1    1/2013    Sakakibara et al.
(Continued)

FOREIGN PATENT DOCUMENTS

CN    103728533 A    4/2014
FR    2996372 A1    4/2014
(Continued)

OTHER PUBLICATIONS

Machine Translation of JP-2012-55109-A, published Mar. 15, 2012.
Ziegler, "Mode of Operation," Numerical Differential Protection, Jan. 27, 2012, XP055497421, pp. 17-51 (37 pages total).

*Primary Examiner* — Neel D Shah
(74) *Attorney, Agent, or Firm* — Birch, Stewart, Kolasch & Birch, LLP (57) ABSTRACT

Provided is an apparatus for determining an abnormal status of a wireless power transmission coil, the apparatus including an input-current sensor configured to detect an input current and provided at an input side of a power transmission coil, an output-current sensor configured to detect an output current and provided at an output side of the transmission coil, and a controller configured to compare each of the input current and the output current with a predetermined threshold value corresponding thereto to determine whether a disconnection or a short circuit occurs in the transmission coil.

18 Claims, 5 Drawing Sheets

(51) Int. Cl.
 *G01R 21/00* (2006.01)
 *H02J 5/00* (2016.01)
 *H01F 38/14* (2006.01)
 *H02J 50/10* (2016.01)
 *B60L 53/12* (2019.01)

(52) U.S. Cl.
 CPC .............. *H02J 50/10* (2016.02); *H01F 38/14* (2013.01); *Y02T 10/7005* (2013.01); *Y02T 10/7072* (2013.01); *Y02T 90/122* (2013.01); *Y02T 90/14* (2013.01)

(56) References Cited

U.S. PATENT DOCUMENTS

| | | | |
|---|---|---|---|
| 2014/0160602 A1 | 6/2014 | Gu et al. | |
| 2015/0001956 A1 | 1/2015 | Saen et al. | |
| 2015/0115734 A1* | 4/2015 | Tawaragi | H02J 17/00 307/104 |

FOREIGN PATENT DOCUMENTS

| | | |
|---|---|---|
| JP | 2001-305175 A | 10/2001 |
| JP | 2010-237187 A | 10/2010 |
| JP | 2011-211854 A | 10/2011 |
| JP | 2012-55109 A | 3/2012 |
| KR | 10-1357828 B1 | 2/2014 |
| WO | WO 2014/157092 A1 | 10/2014 |

* cited by examiner

NORMAL INPUT CURRENT OF COIL

NORMAL OUTPUT CURRENT OF COIL

WHEN DISCONNECTION OCCURS IN FIRST COIL

WHEN DISCONNECTION OCCURS IN SECOND COIL

FIG. 8

NORMAL INPUT CURRENT OF COIL

NORMAL OUTPUT CURRENT OF COIL

WHEN SHORT CIRCUIT OCCURS IN FIRST COIL

WHEN SHORT CIRCUIT OCCURS IN SECOND COIL

APPARATUS FOR DETERMINING ABNORMAL STATUS OF WIRELESS POWER TRANSMISSION COIL

CROSS REFERENCE TO RELATED APPLICATIONS

This application is the National Phase of PCT International Application No. PCT/KR2016/000045, filed on Jan. 5, 2016, which claims priority under 35 U.S.C. 119(a) to Patent Application No. 10-2015-0007333, filed in the Republic of Korea on Jan. 15, 2015, all of which are hereby expressly incorporated by reference into the present application.

TECHNICAL FIELD

The present invention relates to an apparatus for determining an abnormal status of a wireless power transmission coil.

BACKGROUND ART

Wireless charging technology enables it to supply and receive power wirelessly without using a connector to transfer the power. Examples of the wireless charging technology include an electromagnetic induction method using a coil, a wireless power transmission method of transmitting electric energy by transforming the electric energy into a microwave, a resonance method, etc.

For wireless charging, when a device to be wirelessly charged with power is sensed, a wireless power transmitting side transmits and supplies power to the device and determines whether the device needs to be wirelessly charged. When it is determined that the device needs to be wirelessly charged, a power transmission negotiation is conducted and the device which wirelessly receives the power starts being charged.

In this case, since high voltage and high current are used for wireless power transmission, a disconnection or a short circuit may occur in a coil due to a factor, e.g., heat generated for a long time, temperature, corrosion, vibration, shocks, impurities such as dust. When power is continuously supplied to wirelessly transmit the power in a state in which the disconnection or the short circuit occurs in the coil, the power is not transmitted normally and problems such as fire, inner circuit damage, electric shock, etc. may occur.

The wireless charging technology has been currently used in the fields of household appliances, mobile industry, vehicle charging, etc., and is expected to be applied later in the fields of vessels and airplanes. However, a problem as described above may occur when a method of effectively detecting a disconnection or a short circuit occurring in a coil which is a key component of the wireless charging technology is not implemented in a wireless charging system.

DISCLOSURE

Technical Problem

The present invention is directed to an apparatus for determining an abnormal status of a wireless power transmission coil, which is capable of sensing a disconnection or a short circuit occurring in a transmission coil of a wireless charging system.

The present invention is also directed to an apparatus for determining an abnormal status of a wireless power transmission coil, which is capable of determining whether a disconnection or a short circuit occurs in each of a plurality of coils and controlling power to be supplied to each of the plurality of coils when the plurality of transmission coils are used.

Technical Solution

One aspect of the present invention provides an apparatus for determining an abnormal status of a wireless power transmission coil, the apparatus including an input-current sensor configured to detect an input current and provided at an input side of a power transmission coil, an output-current sensor configured to detect an output current and provided at an output side of the transmission coil, and a controller configured to compare each of the input current and the output current with a predetermined threshold value corresponding thereto to determine whether a disconnection or a short circuit occurs in the transmission coil.

The controller may block power from being supplied from a power source when at least one of a disconnection and a short circuit occurs in the transmission coil.

The input-current sensor and the output-current sensor may be provided in units of transmission coils. The controller may determine whether a disconnection or a short circuit occurs with respect to each of the transmission coils.

The controller may set a disconnection input threshold value, a disconnection output threshold value, a short-circuit input threshold value, and a short-circuit output threshold value for each of the transmission coils.

When at least one of a disconnection and a short circuit occurs in one of the transmission coils, the controller may block power from being supplied from a power source to the corresponding transmission coil.

The controller may determine that a disconnection occurs in the transmission coil when the input current is less than a disconnection input threshold value and the output current is less than a disconnection output threshold value.

The controller may set the disconnection input threshold value to 50 to 95% of a normal input current, and the disconnection output threshold value to 0.

The controller may determine that a short circuit occurs in the transmission coil when the input current is greater than a short-circuit input threshold value and the output current is less than a short-circuit output threshold value.

The controller may set the short-circuit output threshold value to 105 to 150% of a normal input current, and the short-circuit output threshold value to 50 to 95% of a normal output current.

The controller may determine that at least one of a disconnection and a short circuit occurs in the transmission coil when each of the input current and the output current does not fall within a range of the predetermined threshold value corresponding thereto for a predetermined time.

The apparatus may further include a notification unit configured to output at least one of a video signal and an audio signal to the outside when at least one of a disconnection and a short circuit occurs in the transmission coil.

Advantageous Effects

An apparatus for determining an abnormal status of a wireless power transmission coil according to the present invention may sense a disconnection or a short circuit occurring in a transmission coil of a wireless charging system.

When a plurality of transmission coils are used, the apparatus may determine whether a disconnection or a short circuit occurs in each of the coils and control power to be supplied to each of the coils.

MODES OF THE INVENTION

Hereinafter, exemplary embodiments of the present invention will be described in detail. However, the present invention is not limited to the exemplary embodiments disclosed below, but can be implemented in various forms. The following exemplary embodiments are described in order to enable those of ordinary skill in the art to embody and practice the invention.

Various changes may be made in the present invention and various embodiments of the present invention may be implemented. Thus, exemplary embodiments are illustrated in the drawings and described as examples herein. However, it should be understood that the present invention is not be construed as being limited thereto and covers all modifications, equivalents, and alternatives falling within the idea and scope of the present invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used here, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprise," "comprising," "include" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Embodiments will now be described in detail with reference to the accompanying drawings. The same or corresponding elements are allocated with the same reference numerals and are not repeatedly described herein to avoid redundancy.

Figure 1:
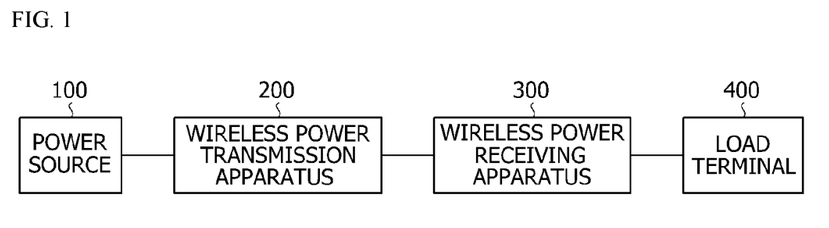
FIG. 1 is a block diagram of a wireless charging system according to an embodiment of the present invention.
Figure 2:
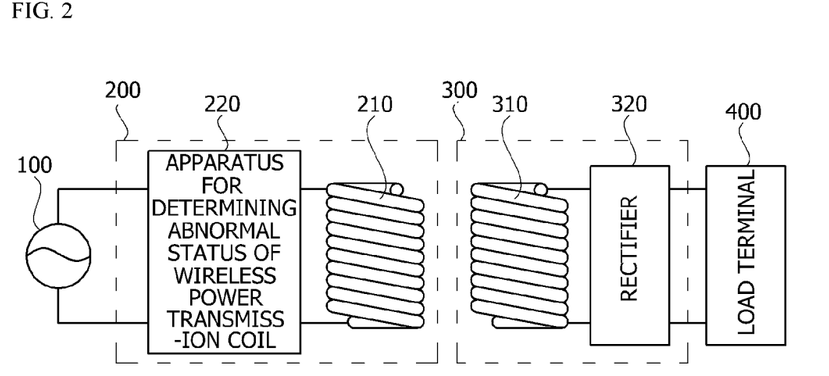
FIG. 2 is a conceptual diagram of an apparatus for determining an abnormal status of a wireless power transmission coil, according to an embodiment of the present invention.

FIG. 1 is a block diagram of a wireless charging system according to an embodiment of the present invention. FIG. 2 is a conceptual diagram of an apparatus for determining an abnormal status of a wireless power transmission coil, according to an embodiment of the present invention, Referring to FIGS. 1 and 2, a wireless charging system 10 may include a power source 100, a wireless power transmission apparatus 200, a wireless power receiving apparatus 300, and a load terminal 400.

The wireless power transmission apparatus 200 is connected to the power source 100 and receives power from the power source 100. The wireless power transmission apparatus 200 wirelessly transmits power to the wireless power receiving apparatus 300. In this case, the wireless power transmission apparatus 200 may transmit power to the wireless power receiving apparatus 300 according to an electromagnetic induction method or a resonance method. Although the power source 100 and the wireless power transmission apparatus 200 are illustrated as different elements, the present invention is not limited thereto. Alternatively, the power source 100 may be included in the wireless power transmission apparatus 200.

The wireless power receiving apparatus 300 wirelessly receives power from the wireless power transmission apparatus 200. The wireless power receiving apparatus 300 may also receive power according to the electromagnetic induction method or the resonance method. The wireless power receiving apparatus 300 supplies the received power to the load terminal 400. The load terminal 400 may be a battery or a device including a battery. Although the load terminal 400 and the wireless power receiving apparatus 300 are illustrated as different elements, the present invention is not limited thereto. Alternatively, the load terminal 400 may be included in the wireless power receiving apparatus 300.

The wireless power transmission apparatus 200 may include a transmission coil 210. The wireless power receiving apparatus 300 may include a receiving coil 310 and a rectifier 320.

The power source 100 may generate alternating-current (AC) power of a predetermined frequency and supply the AC power to the transmission coil 210 of the wireless power transmission apparatus 200.

AC current generated by the transmission coil 210 may be transferred to the receiving coil 310 inductively coupled to the transmission coil 210. Alternatively, power transferred to the transmission coil 210 may be transferred to the wireless power receiving apparatus 300 having the same resonance frequency as that of the wireless power transmission apparatus 200 according to a frequency resonance method. Power may be transmitted between two impedance-matched LC circuits by resonance.

Power transferred to the receiving coil 310 according to the electromagnetic induction method or the resonance method may be rectified by the rectifier 320, and transferred to the load terminal 400.

An apparatus 220 for determining an abnormal status of a wireless power transmission coil may be embodied as a separate device by being electrically connected to a conducting wire connecting the transmission coil 210 of the wireless power transmission apparatus 200 and the power source 100, or may be integrally formed with the wireless power transmission apparatus 200. In one embodiment of the present invention, a case in which the apparatus 220 for determining an abnormal status of a wireless power transmission coil is included in the wireless power transmission apparatus 200 will be described as an example below.

Figure 3:
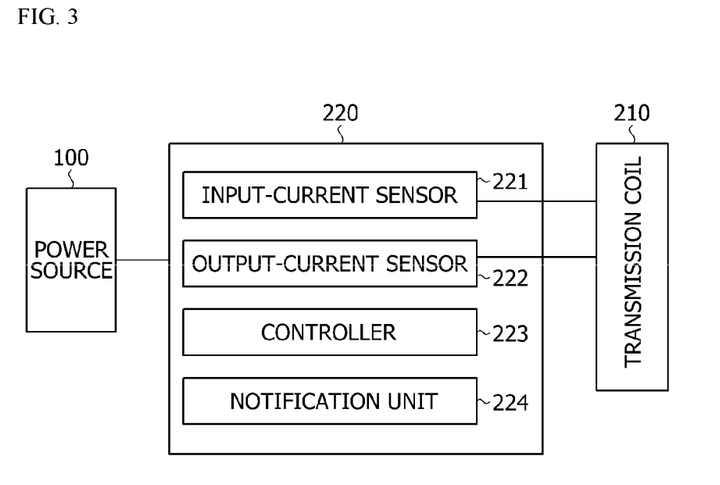
FIG. 3 is a block diagram of an apparatus for determining an abnormal status of a wireless power transmission coil, according to an embodiment of the present invention.

FIG. 3 is a block diagram of an apparatus for determining an abnormal status of a wireless power transmission coil, according to an embodiment of the present invention.

According to an embodiment of the present invention, an apparatus 220 for determining an abnormal status of a wireless power transmission coil may include an input-current sensor 221, an output-current sensor 222, and a controller 223.

First, the input-current sensor 221 may be provided at an input side of the transmission coil 210 to detect an input current. For example, the input-current sensor 221 may include a current transformer, a hall current sensor, or the like. The input-current sensor 221 may measure an input current flowing to the transmission coil 210 from the power source 100, and provide the input current to controller 223.

The output-current sensor 222 may be provided at an output side of the transmission coil 210 to detect an output current. For example, the output-current sensor 222 may include a current transformer, a hall current sensor, or the like. The output-current sensor 222 may measure an output current flowing from the transmission coil 210 and provide the output current to the controller 223. In this case, when the difference between the output current and the input current is excessively large, the output current may be decreased according to a predetermined ratio and be then transferred to the controller 223.

The output-current sensor 222 may include an electric transformer or a transformer to measure voltages of opposite ends of the transmission coil 210. The output current may be calculated from the input current and the voltages of the opposite ends of the transmission coil 210.

The controller 223 may compare the input current and the output current with threshold values corresponding thereto to determine whether a disconnection or a short circuit occurs in the transmission coil 210. The threshold values may include a disconnection input threshold value, a disconnection output threshold value, a short-circuit input threshold value, and a short-circuit output threshold value. Each of the threshold values may be determined in consideration of the intensity of power supplied from the power source 100, the type of a coil, a turn ratio between the transmission coil 210 and a receiving coil, the size of an inductor, whether a passive element is provided or not, etc.

When receiving the input current and the output current, the controller 223 may compare the input current and the output current with the threshold values corresponding thereto to determine whether a disconnection and a short circuit occur.

For example, the controller 223 may determine that a disconnection occurs in the transmission coil 210 when the input current is less than the disconnection input threshold value and the output current is less than the disconnection output threshold value. In this case, the disconnection input threshold value may be set to be less than a normal input current, and the disconnection output threshold value may be set to be less than a normal output current. For example, the controller 223 may set the disconnection input threshold value to 50 to 95% of the normal input current, and set the disconnection output threshold value to 0.

For example, the controller 223 may determine that a short circuit occurs in the transmission coil 210 when the input current is greater than the short-circuit input threshold value and the output current is less than the short-circuit output threshold value. In this case, the short-circuit input threshold value may be set to be greater than the normal input current and the short-circuit output threshold value to be less than the normal output current. For example, the controller 223 may set the short-circuit output threshold value to 105 to 150% of the normal input current and the short-circuit output threshold value to 50 to 95% of the normal output current.

When the input current and the output current do not fall within the ranges of the threshold values for a predetermined time, the controller 223 may determine that at least one of a disconnection and a short circuit occurs in the transmission coil 210. That is, the controller 223 may determine that at least one of a disconnection and a short circuit occurs in the transmission coil 210 when a time period during which the input current and the output current do not fall within the ranges of the threshold values is greater than or equal to the predetermined time to prevent an erroneous determination caused by noise, a sudden shock, or the like. The predetermined time may be differently set for a case in which whether a disconnection occurs in the transmission coil 210 is determined and a case in which whether a short circuit occurs in the transmission coil 210 is determined, and may be measured by continuously counting a number of times that each of the input current and the output current does not fall within the range of the threshold value thereof.

The controller 223 may block power supplied from the power source 100 when at least one of a disconnection and a short circuit occurs in the transmission coil 210. For example, the controller 223 may control voltage not to be applied to the transmission coil 210 by controlling the power source 100 or a switching element (not shown) to adjust a transmission voltage or by turning off the power source 100.

A notification unit 224 may output at least one of a video signal and an audio signal to the outside when at least one of a disconnection and a short circuit occurs in the transmission coil 210. The notification unit 224 may include a means such as a light-emitting diode (LED), a display, or a 7-segment display to output the video signal, and a means such as a speaker to output the audio signal. The notification unit 224 may be operated when the controller 223 sets the short-circuit output threshold value to 105 to 150% of the normal input current and the short-circuit output threshold value to 50 to 95% of the normal output current, and may determine whether a disconnection or a short circuit occurs and output at least one of the video signal and the audio signal to the outside.

Figure 4:
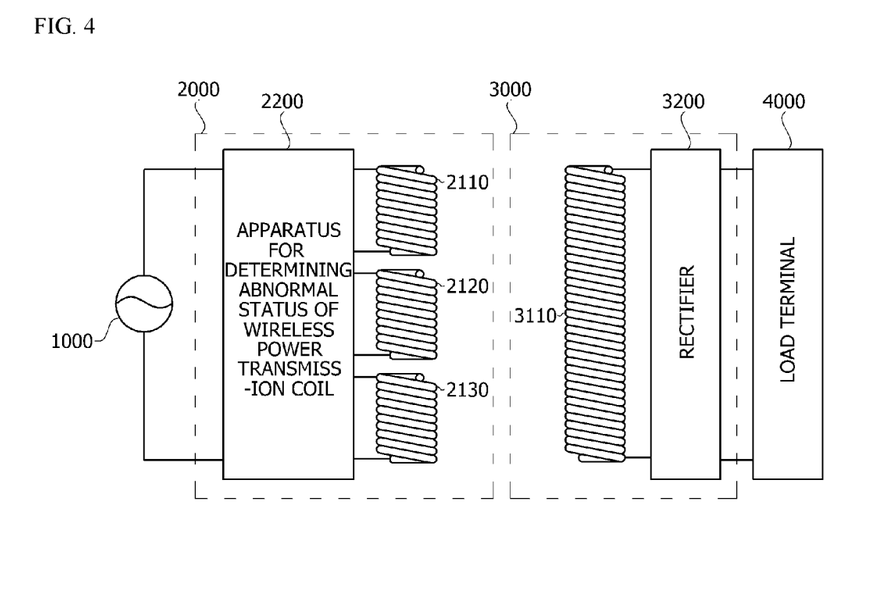
FIG. 4 is a conceptual diagram of a wireless charging system according to another embodiment of the present invention.
Figure 5:
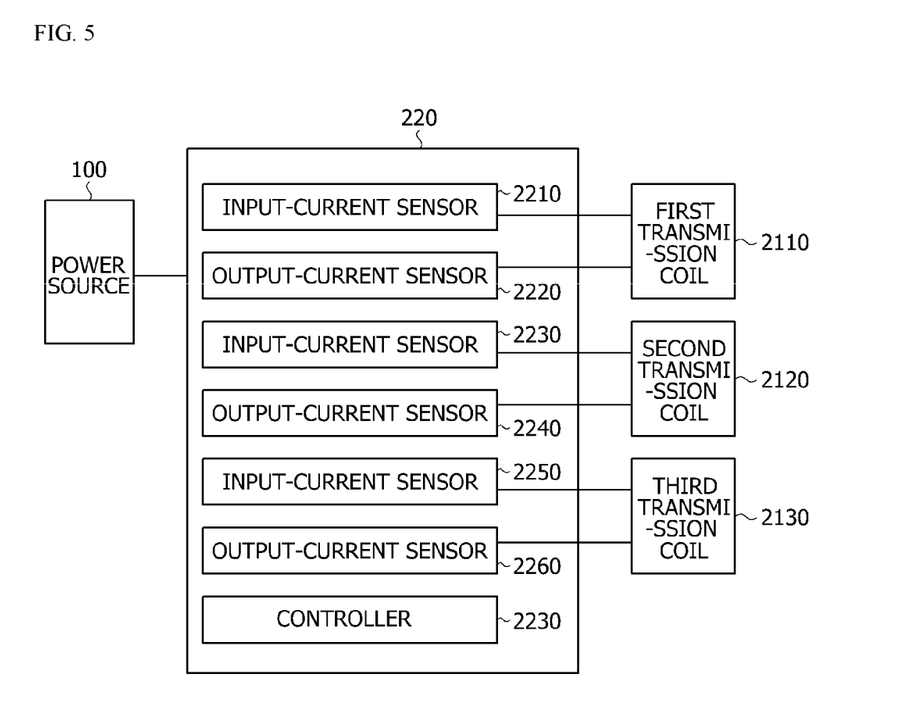
FIG. 5 is a block diagram of an apparatus for determining an abnormal status of a wireless power transmission coil, according to another embodiment of the present invention.

FIG. 4 is a conceptual diagram of a wireless charging system according to another embodiment of the present invention. FIG. 5 is a block diagram of an apparatus for determining an abnormal status of a wireless power transmission coil, according to another embodiment of the present invention.

Referring to FIGS. 4 and 5, in the wireless charging system according to another embodiment of the present invention, three transmission coils 2110, 2120, and 2130 are provided on a wireless power transmission apparatus 2200, and input-current sensors 2210, 2230, and 2250 and output-current sensors 2220, 2240, and 2260 are provided to correspond to the transmission coils 2110, 2120, and 2130. The input-current sensors 2210, 2230, and 2250 and the output-current sensors 2220, 2240, and 2260 may detect an input current flowing into the transmission coils 2110, 2120, and 2130 and an output current flowing from the transmission coils 2110, 2120, and 2130, and transfer the input and output currents to a controller 2270. The input-current sensors 2210, 2230, and 2250 and the output-current sensors 2220, 2240, and 2260 are allocated with identification (ID) information thereof and may transfer the detected input and output currents to the controller 2270, together with the ID information.

The controller 2270 may compare the input current and the output current measured with respect to each of the transmission coils 2110, 2120, and 2130 with threshold values thereof to determine whether a disconnection or a short circuit occurs. When a disconnection or a short circuit occurs, the controller 2270 may detect the transmission coil 2110, 2120, or 2130 in which a disconnection or a short circuit occurs on the basis of the ID information.

In this case, the controller 2270 may set a disconnection input threshold value, a disconnection output threshold value, a short-circuit input threshold value, and a short-circuit output threshold value for each of the transmission coils 2110, 2120, and 2130. That is, the controller 2270 may individually set the disconnection input threshold value, the disconnection output threshold value, the short-circuit input threshold value, and the short-circuit output threshold value for each of the transmission coils 2110, 2120, and 2130. Thus, these threshold values may be different values.

When at least one of a disconnection and a short circuit occurs in the transmission coil 2110, 2120, or 2130, the controller 2270 may block power from being supplied to the corresponding transmission coil 2110, 2120, or 2130 from a power source 1000. For example, the controller 2270 may control voltage not to be applied to the transmission coil 2110, 2120, or 2130 by, for example, controlling the power source 1000 or a switching element to adjust a transmission voltage to be applied to the transmission coil 2110, 2120, or 2130 in which a disconnection or a short circuit occurs or by turning off the power source 1000.

Figure 6:
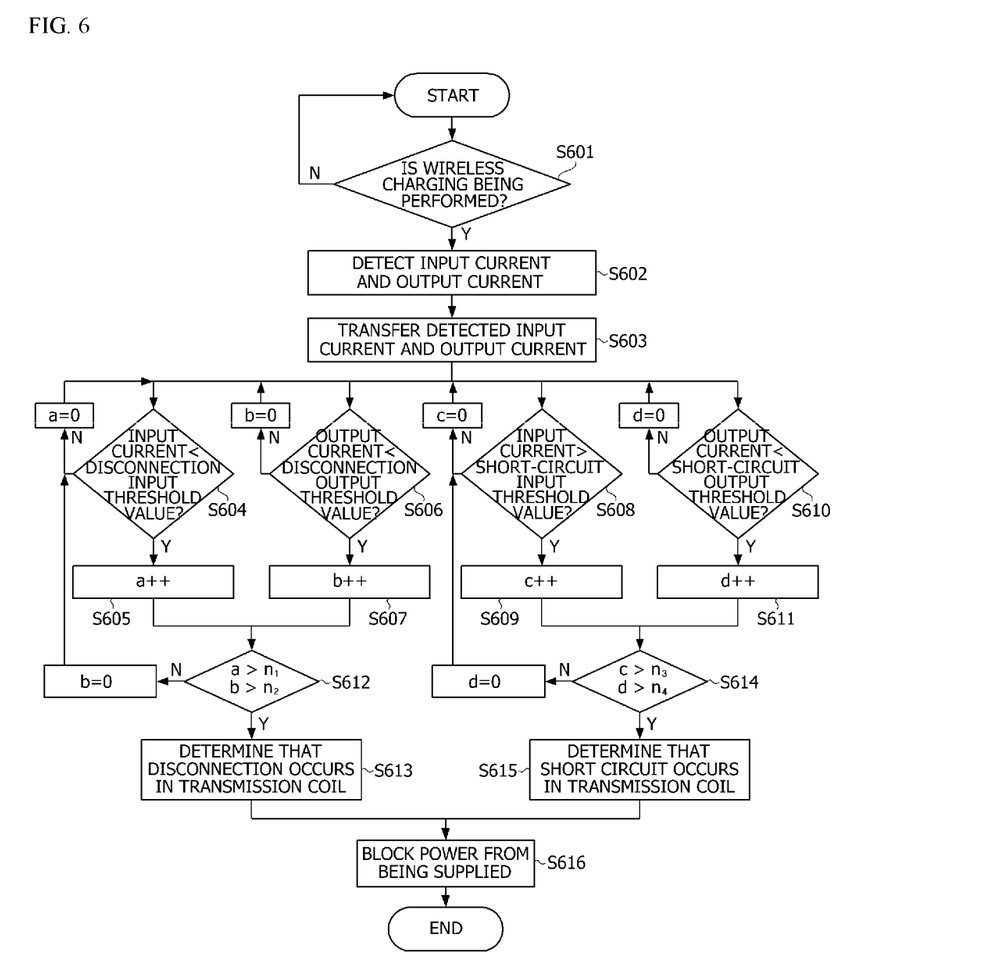
FIG. 6 is a flowchart of an operation of an apparatus for determining an abnormal status of a wireless power transmission coil, according to an embodiment of the present invention.

FIG. 6 is a flowchart of an operation of an apparatus for determining an abnormal status of a wireless power transmission coil, according to an embodiment of the present invention.

Referring to FIG. 6, first, the apparatus for determining an abnormal status of a wireless power transmission coil determines whether a wireless charging system is performing wireless charging. The apparatus for determining an abnormal status of a wireless power transmission coil senses a Ping signal received from a system to determine whether wireless charging is performed (operation S601).

While wireless charging is performed, the apparatus for determining an abnormal status of a wireless power transmission coil detects an input current flowing to a transmission coil and an output current flowing from the transmission coil through an input-current sensor and an output-current sensor (operation S602).

The input-current sensor and the output-current sensor transfer the detected input and output currents to a controller (operation S603).

The controller compares the input current with a disconnection input threshold value, and increases a number of times to count a variable a when the input current is less than the disconnection input threshold value and initializes the variable a when the input current is greater than or equal to the disconnection input threshold value; and compares the output current with a disconnection output threshold value, and increases a number of times to count a variable b when the output current is less than the disconnection output threshold value and initializes the variable b when the output current is greater than or equal to the disconnection output threshold value (operations S604 to 607).

The controller compares the input current with a short-circuit input threshold value, and increases a number of times to count a variable c when the input current is greater than the short-circuit input threshold value and initializes the variable c when the input current is equal to or less than the short-circuit input threshold value; and compares the output current with a short-circuit output threshold value, and increases a number of times to count a variable d when the output current is less than the short-circuit output threshold value and initializes the variable d when the output current is greater than or equal to the short-circuit output threshold value (operations S608 to 611).

Next, the controller determines that a disconnection occurs in the transmission coil when the number of times to count each of the variables a and b exceeds a predetermined number corresponding thereto (operations S612 and 613).

Furthermore, the controller determines that a short circuit occurs in the transmission coil when the number of times to count each of the variables c and d exceeds a predetermined number corresponding thereto (operations S614 and 615).

When at least one of a disconnection and a short circuit occurs, the controller controls a power source to block power from being supplied to the corresponding transmission coil (operation S616).

A disconnection determination algorithm and a short-circuit determination algorithm of the controller are not required to be performed in a specific order, and may be performed simultaneously or the short-circuit determination algorithm may be first performed.

Figure 7:
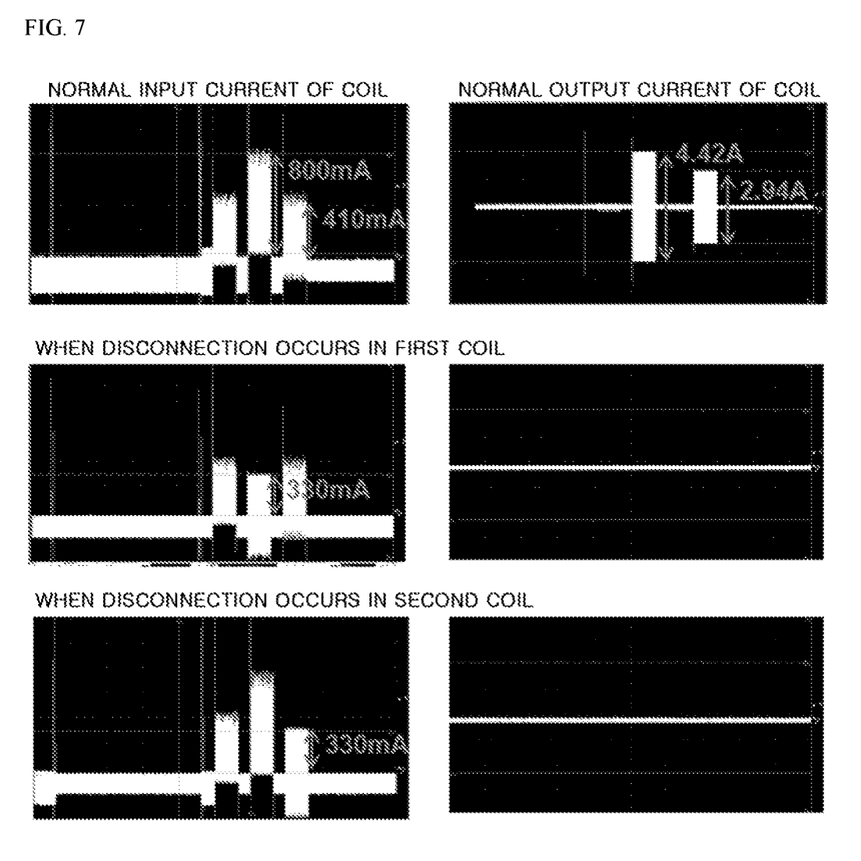
FIG. 7 is a graph showing an operation of a controller according to an embodiment of the present invention.

FIG. 7 is a graph showing an operation of a controller according to an embodiment of the present invention.

Referring to FIG. 7, normal input currents of respective first and second transmission coils are measured to be 800 mA and 410 mA, and normal output currents thereof are respectively measured to be 4.42 A and 2.94 A. The controller determines that a disconnection occurs in the first transmission coil when an input current of the first transmission coil is less than a disconnection input threshold value of 700 mA and an output current thereof is less than a disconnection output threshold value of 100 mA. When the disconnection occurs in the transmission coil, the output current approaches 0 and the disconnection output threshold value may be thus set to a value close to 0.

The controller determines that a disconnection occurs in the second transmission coil when an input current of the second transmission coil is less than a disconnection input threshold value of 350 mA and an output current thereof is less than a disconnection output threshold value of 100 mA.

The disconnection input threshold value and the disconnection output threshold value may be differently set for each of the first and second transmission coils.

Figure 8:
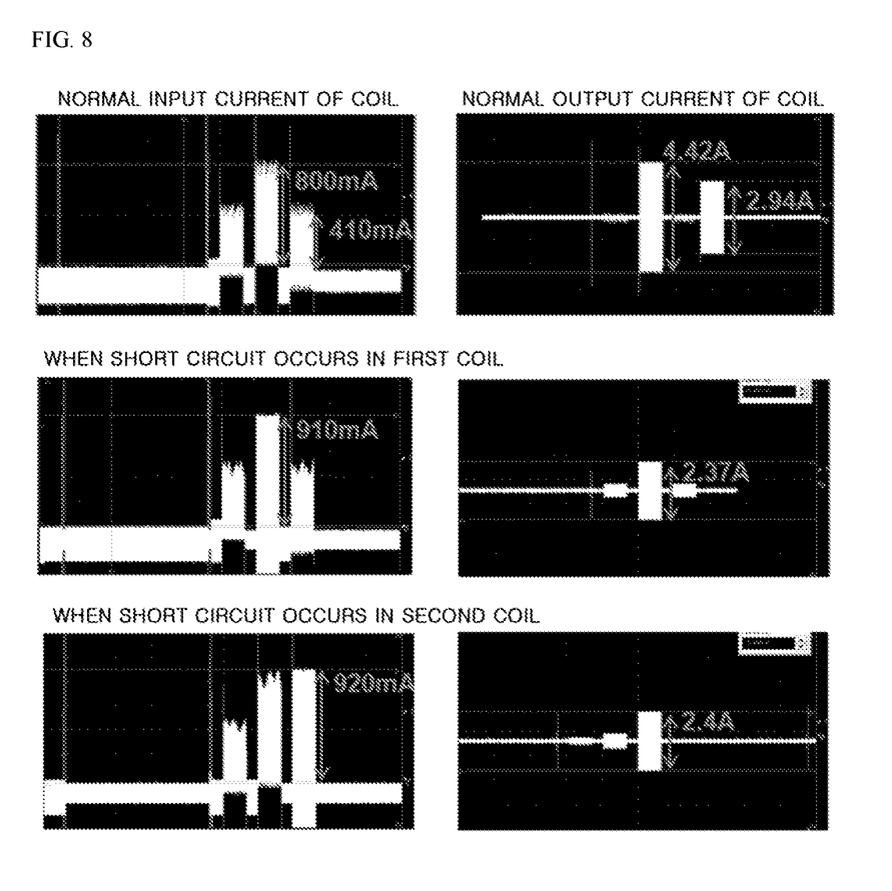
FIG. 8 is a graph showing an operation of a controller according to another embodiment of the present invention.

FIG. 8 is a graph showing an operation of a controller according to another embodiment of the present invention.

Referring to FIG. 8, normal input currents of respective first and second transmission coils are measured to be 800 mA and 410 mA and normal output currents thereof are measured to be 4.42 A and 2.94 A. The controller determines that a short circuit occurs in the first transmission coil when an input current of the first transmission coil is greater than a short-circuit input threshold value of 850 mA and an output current thereof is less than a short-circuit output threshold value of 3 A.

Furthermore, the controller determines that a short circuit occurs in the second transmission coil when an input current of the second transmission coil is greater than a short-circuit input threshold value of 800 mA and an output current thereof is less than a short-circuit output threshold value of 2.5 A.

The short-circuit input threshold value and the short-circuit output threshold value may be differently set for each of the first and second transmission coils.

In the embodiments set forth herein, the term 'unit' should be understood to mean software or a hardware element such as a field-programmable gate array (FPGA) or application specific integrated circuit (ASIC), which performs certain operations. However, the term 'unit' should not be understood as being limited to software or a hardware element. The term 'unit' may be understood to mean an element included in an addressable storage medium or configured to replay one or more processors. Thus, for example, the term 'unit' should be understood to include elements, such as software elements, object-oriented software elements, class elements, and task elements, processes, functions, attributes, procedures, subroutines, segments of program code, drivers, firmware, microcode, circuits, data, database, data structures, tables, arrays, and variables. Functions of elements and units may be combined to obtain a smaller number of elements and a smaller number of units or may be divided to obtain additional elements and additional units. Furthermore, the elements and the units may be embodied to replay one or more central processing units (CPUs) included in a device or a security multimedia card.

While exemplary embodiments of the present invention have been described above, it would be apparent to those of ordinary skill in the art that various changes and modifications may be made in the present invention without departing from the idea and scope of the present invention defined in the appended claims.

The invention claimed is:

1. An apparatus for determining an abnormal status of a wireless power transmission coil, the apparatus comprising:
    an input-current sensor configured to detect an input current, the input-current sensor being provided at an input side of a power transmission coil;
    an output-current sensor configured to detect an output current, the output-current sensor being provided at an output side of the transmission coil; and
    a controller unit configured to determine that a disconnection occurs in the transmission coil when the input current is less than a disconnection input threshold value and the output current is less than a disconnection output threshold value, and determines that a short circuit occurs in the transmission coil when the input current is greater than a short-circuit input threshold value and the output current is less than a short-circuit output threshold value.

2. The apparatus of claim 1, wherein the controller unit blocks power from being supplied from a power source when at least one of a disconnection and a short circuit occurs in the transmission coil.

3. The apparatus of claim 1, wherein the input-current sensor and the output-current sensor are provided in units of transmission coils,
    wherein the controller unit determines whether a disconnection or a short circuit occurs with respect to each of the transmission coils.

4. The apparatus of claim 3, wherein the input-current sensor and the output-current sensor corresponding to each of the transmission coils comprise identification (ID) information of the corresponding transmission coil, and transfer a detected input current and output current and the ID information to the controller unit.

5. The apparatus of claim 3, wherein the controller unit sets the disconnection input threshold value the disconnection output threshold value, the short-circuit input threshold value, and the short-circuit output threshold value for each of the transmission coils.

6. The apparatus of claim 4, wherein, when at least one of a disconnection and a short circuit occurs in one of the transmission coils, the controller unit blocks power from being supplied from a power source to the corresponding transmission coil.

7. The apparatus of claim 6, wherein the controller unit specifies the transmission coil in which at least one of the disconnection and the short circuit occurs on the basis of the ID information.

8. The apparatus of claim 1, wherein the disconnection input threshold value is set to be less than a normal input current, and
    the disconnection output threshold value is set to be less than a normal output current.

9. The apparatus of claim 8, wherein the controller unit sets the disconnection input threshold value to 50 to 95% of the normal input current, and the disconnection output threshold value to 0.

10. The apparatus of claim 1, wherein the short-circuit input threshold value is set to be greater than a normal input current, and
    the short-circuit output threshold value is set to be less than a normal output current.

11. The apparatus of claim 10, wherein the controller unit sets the short-circuit output threshold value to 105 to 150% of the normal input current, and the short-circuit output threshold value to 50 to 95% of the normal output current.

12. The apparatus of claim 1, wherein the controller unit determines that at least one of a disconnection and a short circuit occurs in the transmission coil when each of the input current and the output current does not fall within a range of the predetermined threshold value corresponding thereto for a predetermined time.

13. The apparatus of claim 12, wherein the predetermined time is differently set for a case in which whether a disconnection occurs is determined and a case in which whether a short circuit occurs is determined.

14. The apparatus of claim 12, wherein the controller unit determines whether at least one of a disconnection and a short circuit occurs in the transmission coil by continuously counting a number of times that each of the input current and the output current does not fall within the range of the predetermined threshold value corresponding thereto.

15. The apparatus of claim 1, further comprising a notification unit configured to output at least one of a video signal and an audio signal to the outside when at least one of a disconnection and a short circuit occurs in the transmission coil.

16. The apparatus of claim 1, wherein each of the predetermined threshold values is determined in consideration of at least one among an intensity of power supplied from a power source, a type of a coil, a turn ratio between the transmission coil and a receiving coil, a size of an inductor, and whether a different passive element is arranged or not.

17. The apparatus of claim 1, wherein the input-current sensor comprises at least one of a current transformer and a hall current sensor.

18. The apparatus of claim 1, wherein the output-current sensor comprises at least one of a current transformer, a hall current sensor, an electric transformer, and a transformer.

* * * * *